United States Patent [19]

Richley

[11] Patent Number: 5,223,755
[45] Date of Patent: Jun. 29, 1993

[54] EXTENDED FREQUENCY RANGE VARIABLE DELAY LOCKED LOOP FOR CLOCK SYNCHRONIZATION

[75] Inventor: Edward A. Richley, Mountian View, Calif.

[73] Assignee: Xerox Corporation, Stamford, Conn.

[21] Appl. No.: 633,819

[22] Filed: Dec. 26, 1990

[51] Int. Cl.⁵ .................. H03K 5/13; H03K 5/159; H03K 17/28; H03L 7/00
[52] U.S. Cl. .................................... 307/603; 331/1 A
[58] Field of Search ............... 331/1 A, 25; 375/120; 307/603, 514

[56] References Cited

U.S. PATENT DOCUMENTS

| | | | |
|---|---|---|---|
| 4,222,013 | 9/1980 | Bowers et al. | 331/1 A |
| 4,281,259 | 7/1981 | Ozawa | 307/514 |
| 4,365,211 | 12/1982 | Lee | 307/517 |
| 4,618,788 | 10/1986 | Jacksier et al. | 307/603 |
| 4,745,310 | 5/1988 | Swapp | 307/603 |
| 4,847,875 | 7/1989 | Choi | 375/120 |
| 4,893,094 | 1/1990 | Herold et al. | 331/1 A |
| 5,028,823 | 7/1991 | Watanabe | 307/603 |
| 5,050,193 | 9/1991 | Ponsard | 375/120 |
| 5,055,800 | 10/1991 | Black et al. | 331/1 A |
| 5,059,833 | 10/1991 | Fujii | 331/1 A |

OTHER PUBLICATIONS

"A Variable Delay Line for PLLCPU Co-processor Synchronization", Mark G. Johnson and Edwin L Hudson; IEEE Journal of Solid State Circuits, vol. 23, No. 5 Oct. 1988.

"Design of PLL-Based Clock Generation Circuits", Deog-Kyoon Jeong et al.; IEEE Journal of Solid Circuits, vol. SC-22, No. 2 Apr. 1987.

Primary Examiner—Eugene R. LaRoche
Assistant Examiner—Michael C. Kessell
Attorney, Agent, or Firm—Anglin & Giaccherini

[57] ABSTRACT

A Delay Locked Loop For Clock Synchronization is disclosed that solves the problem of aligning a clock signal ($V_{OUT}$) with a reference signal (REF) in the shortest time and without instability. The clock signal ($V_{OUT}$) is passed through an conventional, variable delay line (20) whose phase delay is controlled by a charge ($V_{CTRL}$) on a capacitor (C). The invention employs an improved phase detection system (21) including first and second phase detectors (22), (26) and a first logic gate (28). The reference signal (REF) is delayed at the second phase detector (26). A logic circuit (30) is reset by a pulse (nReset) charging the capacitor (C) to a maximum voltage ($V_{CTRL}$). Maximum voltage ($V_{CTRL}$) drives the variable delay line (20) to the minimum achievable delay. The reset pulse (nReset) is then removed, and the voltage ($V_{CTRL}$) is bled from the capacitor (C), increasing the phase delay between the clock signal ($V_{OUT}$) and the reference signal (REF). When the clock signal ($V_{OUT}$) has been delayed sufficiently that the first and second phase detectors (22), (26) agree that more phase delay will bring the clock signal ($V_{OUT}$) into alignment with the reference signal (REF), the set-reset circuit (32) is set. This enables the complimentary output (nQ) of the first phase detector (22) to regulate the voltage ($V_{CTRL}$) on the capacitor (C), adjusting the variable delay line (20) to bring the clock signal ($V_{OUT}$) into alignment with the reference signal (REF).

8 Claims, 2 Drawing Sheets

EXTENDED FREQUENCY RANGE VARIABLE DELAY LOCKED LOOP FOR CLOCK SYNCHRONIZATION

BACKGROUND OF THE INVENTION

The present invention is an improved method and apparatus for bringing locally regenerated clock signals, distributed among multiple loads, into time alignment with a reference clock signal. The improvement minimizes start-up time from reset and prevents instability in achieving synchronization in phase-locked loop circuits employing an analog, variable delay line. The invention overcomes the limitation of such circuits which require minimum phase delay time to be less than one-half period of the clock signal and permits operation at frequencies up to the highest that can be passed along the delay line. Frequencies several times those currently used in high speed computers, whose speeds can be of the order of 10 million instructions per second, are easily accommodated.

In a high-speed, multiple chip synchronous computer, the clock signal must be delivered to all chips very carefully. The skew or difference in time between the significant edges of clock signals in different parts of the system typically must be held to one nanosecond or less. A distributed system for regeneration of powerful clock signals from a lower-power master reference signal is more desirable than a central clock because of the very large amount of power required. The regeneration must be performed at all sites in the computer and in the presence of amplification stages so that all regenerated clock signals are produced with minimum skew. Phase-locked loop circuits using a voltage controlled oscillator, phase-frequency detector and an analog, variable delay line delay have typically been used to synchronize computer clocks. Phase locked loop circuits using a variable delay line are referred to herein as a "delay locked loop" circuits.

The delay locked loop, which uses an analog delay line based on a sequence of voltage-controlled delay elements, is the simpler, more versatile approach to a clock regeneration circuit. The delay locked loop circuit detects the phase difference between clock signals of the same frequency and produces an error voltage varying with the phase difference. By feeding back such voltage to control a variable delay line, the timing of one clock signal is advanced or delayed until its rising edge is coincident with the rising edge of the reference signal. Conventional delay locked loop circuits have a major drawback. Any delay line and amplifier will have a minimum achievable delay when the control voltage is maximum. In systems where the clock signal is derived from the reference signal, if the clock frequency is raised until a one-half period is slightly less than the minimum achievable delay, the phase detector will cause the system to seek a faster operating point at less delay. This clearly can not be reached. Only certain bands of higher frequencies will allow stable-from-reset synchronization, for example when minimum delay equals one and one-half periods.

The problem of providing a clock regeneration system which will achieve stable lock in the shortest time, irrespective of whether the phase of the local clock signal is leading or lagging relative to the phase of the reference clock, has been a major challenge to designers in the high-speed computer field. The enhancement of circumventing the minimum delay problem without sacrificing resolution of the delay line circuit and without adding a prohibitive number of stages would satisfy a long felt need in the computer industry.

SUMMARY OF THE INVENTION

The Extended Frequency Range Delay Locked Loop for Clock Synchronization is an improved method and apparatus that solves the problem of instability and long start-up time from reset in achieving synchronism in phase-locked loop circuits employing an analog, variable delay line. The present invention initially drives the variable delay line to its minimum phase delay upon application of a reset pulse. The reset logic then forces the clock signal to longer delay with respect to the reference by decreasing the delay line control voltage. When the clock signal has been delayed sufficiently that the phase detector detects a condition in which more delay is needed to bring the clock signal into alignment with the reference signal, the circuit logic allows the phase detector to control the delay line. A second, delayed phase detector ensures that the point at which the phase detector takes control is sufficiently beyond the point at which more delay in the clock signal is detected to be needed so as to overcome any "jitter" in the detected phase difference. The reset may be activated at start-up, when frequency is changed or at other times to ensure the most stable lock.

An appreciation of other aims and objectives of the present invention and a more complete understanding of this invention may be had by studying the following description of the preferred embodiment and by referring to the accompanying drawings.

DETAILED DESCRIPTION OF A PREFERRED EMBODIMENT

Figure 1:
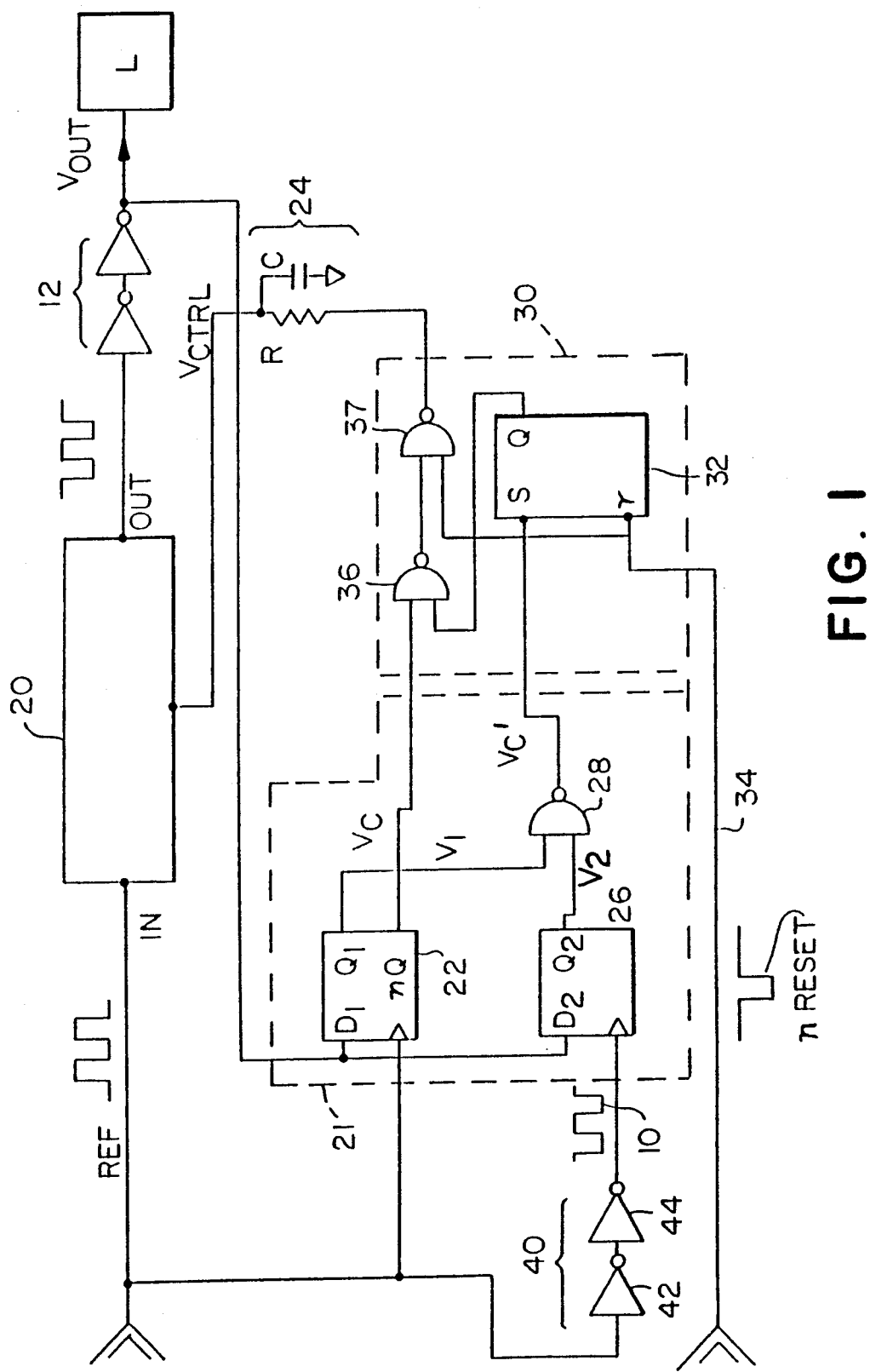
FIG. 1 is a schematic diagram of the Extended Frequency Range Delay Locked Loop For Clock Synchronization.

FIG. 1 depicts a schematic diagram of a preferred embodiment of the Extended Frequency Range Variable Delay Locked Loop for Clock Synchronization which can accomodate frequencies several times those currently used in high-speed computers, whose speeds can be of the order of 10 million instructions per second. A low-power clock reference signal (REF) is regenerated as a high power clock signal ($V_{OUT}$) by inverting amplifiers (12) after passing through a variable delay line (20), and distributed to a load (L). The delay line (20) may be based on a series of tapped stages of delay elements. As shown, the delay line (20) has an additional stage to invert its output (OUT) with respect to its input (IN). This allows the system to operate with less total delay for low frequency clock signals ($V_{OUT}$) giving greater stability. The clock signal ($V_{OUT}$) is fed back to the phase detection circuit (21) which is used to compare its phase with that of the reference signal (REF). The phase detection circuit (21) includes first and second, edge-triggered digital flip-flop circuits (22), (26) as phase detectors having respective first input terminals ($D_1$), ($D_2$) and respective second input terminals. They are both coupled to the inputs of a first NAND logic gate (28). The reference signal (REF) is coupled directly to the first digital phase detector (22) and through two inverters (42), (44) which produce a slightly delayed reference signal (10), to the second, delayed phase detector (26). The outputs (Vc), (Vc') from the phase detection circuit (21) are fed to the reset logic circuit (30). The reset logic circuit includes a logic circuit with set and reset input terminals (s), (r) and a latched output terminal (Q). It also includes second and third NAND logic gates (36), (37) coupled together and to the latched output terminal (Q) of the set-reset logic circuit (30). One output (Vc') of the phase detection circuit (21) is used to set the set-reset logic circuit (32) to a state which allows the other output (Vc) to control the variable delay line (20) by charging the capacitor (C) through the resistor (R) to a value of $V_{CTRL}$. A reset signal conductor (34), through which a reset signal pulse (nReset) is applied, is coupled to the reset logic circuit.

For purposes of the following discussion, states of the various logic circuits are described as logic zero and logic one where logic zero is a voltage of near zero volts or less and logic one is a higher voltage, consistent with the characteristics of the logic device. If it is assumed that the clock signal ($V_{OUT}$) lags the reference signal (REF), the initial conditions of the circuit logic, for example at turn-on of the system, will be as follows: One output terminal ($Q_1$) of the first digital phase detector (22) will have an output ($V_1$) at logic zero and its complementary output terminal (nQ) will be at logic one. An output ($V_2$) at logic zero will also exist at an output terminal ($Q_2$) of the second, delayed digital phase detector (26). With logic zero at both inputs of the first logic gate (28), the phase detection circuit output (Vc') will be at logic one. The set-reset circuit (32) will be set to an output of logic one.

To bring the clock signal ($V_{OUT}$) into synchronization with the reference signal (REF), the following actions occur: First, a negative-going reset signal pulse (nReset) of a duration long enough to cause a capacitor (C) to reach a maximum voltage ($V_{CTRL}$) is applied through the reset signal conductor (34) to the reset terminal of the set-reset logic circuit (32) and to one input of the third logic gate (37). This can be done automatically at system start-up or at any time stable lock is desired. The output (Q) of the set-reset logic gate (32) is thereby driven to logic zero where it remains latched and the third logic gate (37) is disabled. That is, because one input of the logic gate (37) is at logic zero, a change of logic state at the other input of the logic gate (37) will not affect its output which is at logic one. The output voltage of the third logic gate (37) charges the capacitor (C) to a maximum value of control voltage ($V_{CTRL}$) which corresponds to the minimum delay time achievable by the variable delay line (20). The output of the set-reset logic (32) is also coupled to one input of the second logic gate (36) and therefore provides a logic zero to this point when the reset signal pulse (nReset) is applied. The second logic gate (36) is thereby disabled.

Its output at logic one is applied to an input of the third logic gate (37). When the reset signal conductor (34) returns to its original state of logic one, the third logic gate (37) output goes to logic zero and the control voltage ($V_{CTRL}$) charge on the capacitor (C) bleeds off. As $V_{CTRL}$ is reduced, the delay of the variable delay line (20) increases accordingly, increasing the delay between the clock signal ($V_{OUT}$) and the reference signal (REF). The delay continues to increase until both the first phase detector (22) and the second, delayed phase detector (26) detect the condition that more delay is required to bring the two clock signals ($V_{OUT}$), (REF) into synchronization. At this point, the output ($Q_1$), ($Q_2$) of each phase detector (22), (26) becomes logic one and the complementary output (nQ) of the first phase detector (22) becomes logic zero. The first logic gate (28) will now have both inputs at logic one and its output (Vc') will become logic zero. The application of logic zero to the set terminal (s) of the set-reset circuit (32) changes the output state at terminal Q to logic one, enabling the second logic gate (36). This permits the first phase detector output (Vc) to change the output at both the second and third logic gate (36), (37) which charges the capacitor (C) to the control voltage ($V_{CTRL}$). The control voltage ($V_{CTRL}$) is thereby regulated according to the phase difference between the clock signal ($V_{OUT}$) and reference signal (REF) until the two signals ($V_{OUT}$), (REF) are brought into synchronization. The second, delayed phase detector (26) insures that when the first phase detector (22) takes control, the falling edge of the clock signal ($V_{OUT}$) is sufficiently beyond the leading edge rise of the reference signal (REF) that phase noise on the signals ($V_{OUT}$), (REF) will not cause the first phase detector (22) to request less than the minimum achievable delay.

It can be seen by further examining the circuit logic that if at the time a reset signal pulse is applied the clock signal ($V_{OUT}$) leads instead of lags the reference signal (REF), the phase detector (22) will immediately control the delay line (20) increasing delay until synchronism is achieved.

The change in timing from turn-on to stable lock may be seen more graphically by referring to FIGS. 2(a through d). FIG. (a) depicts a timing diagram which compares the wave forms (56) of a clock signal ($V_{OUT}$) and the wave form (54) of a reference signal (REF) in time, just after initiating the reset process by applying a reset signal pulse (nReset). In this case, the minimum achievable phase delay ($T_{MIN}$) is assumed to be larger than one-half period of the clock signal ($V_{OUT}$) wave form (56).

Figure 2A:
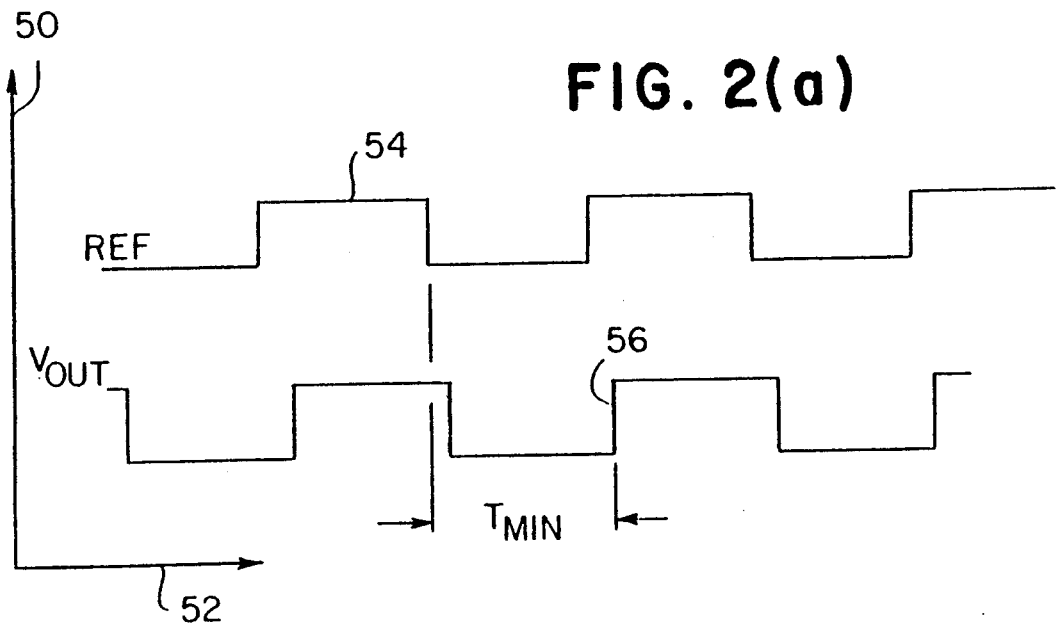
FIG. 2(a) is a timing diagram showing the relationship of a clock signal and a reference signal at the point when a reset has been initiated.
Figure 2B:
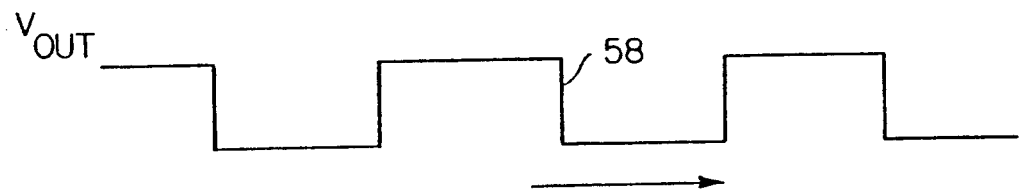
FIG. 2(b) is a timing diagram of the clock signal showing its phase change as the delay line control voltage is decreased.

FIG. 2(b) shows the timing of the clock signal ($V_{OUT}$) immediately after the reset pulse (nReset) has been released and the control voltage ($V_{CTRL}$) begins falling. The clock signal ($V_{OUT}$) delay begins increasing as indicated by the waveform (58) having moved to the right in the diagram.

Figure 2C:
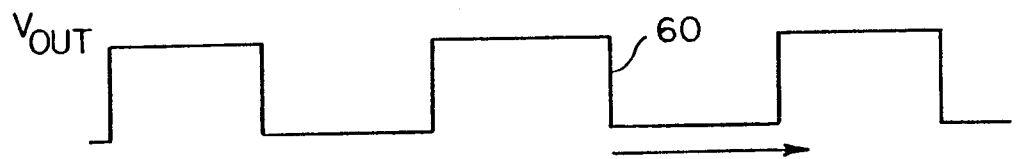
FIG. 2(c) is a timing diagram of the clock signal showing its phase change as the phase detector takes control of the delay line.

FIG. 2(c) depicts the timing of the clock signal ($V_{OUT}$) at the point where the first phase detector (22) is allowed to take control of the variable delay line (20). The clock signal ($V_{OUT}$) is further delayed as indicated by the wave form (60) having moved further to the right in the diagram.

Figure 2D:
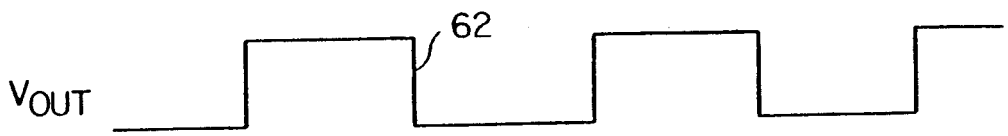
FIG. 2(d) is a timing diagram of the clock signal after the phase detector has controlled the variable delay line to achieve synchronism between the clock signal and the reference signal.

FIG. 2(d) depicts the timing of the clock signal ($V_{OUT}$) after it has been brought into synchronism with the reference signal (REF) by still further delay caused by regulation of the control voltage ($V_{CTRL}$) by the first phase detector (22). The clock signal ($V_{OUT}$) waveform

LIST OF REFERENCE NUMERALS

FIG. 1

10 Delayed reference signal
12 Clock amplifiers
20 variable delay line
21 Phase detection circuit
22 First digital phase detector
24 Low pass filter
26 Second, delayed digital phase detector
28 First logic gate
30 Reset logic circuit
32 Set-reset flip-flop circuit
Reset signal conductor
36 Second logic gate
37 Third logic gate
40 Fixed delay element
42 First inverter
44 Second inverter nQ First phase detector second, complimentary output terminal
$D_1$ First phase detector, first input terminal
$D_2$ Second, delayed phase detector, first input terminal
nReset Delay reset signal
$Q_1$ First phase detector first output terminal
$Q_2$ Second, delayed phase detector output terminal
L Circuit load
REF Reference signal
Vc First phase detector output control voltage
Vc' Second, delayed phase detector output control voltage
$V_{CTRL}$ Delay line control voltage
$V_{OUT}$ Clock signal
$V_1$ First phase detector output voltage
$V_2$ Second, delayed phase detector output voltage

FIG. 2(a, b, c, and d)

50 Signal amplitude axis
52 Time axis
54 Reference signal wave form
56 Clock signal wave form at reset
58 Clock signal wave form just after reset
60 Clock signal wave form when phase detector first takes control
62 Clock signal wave form when clock signal is synchronized with reference signal
REF Reference signal
$T_{min}$ minimum achievable relay time
$V_{OUT}$ Clock signal.

What is claimed is:

1. An improved variable delay locked loop for synchronization of clock signals having an extended frequency range, of a type having a clock signal ($V_{OUT}$) which is derived from a low-power reference signal (REF) but which is displaced in time from said reference signal (REF) because of an inherent time delay action of an amplification device needed to boost said clock signal ($V_{OUT}$) for use in a circuit (L) demanding high power, and which is brought into time alignment with said reference signal (REF) when a phase difference between said clock signal ($V_{OUT}$) and said reference signal (REF) is detected by a phase detector (22) which feeds back a variable delay control voltage ($V_{CTRL}$) to a variable delay line (20), through which said clock signal ($V_{OUT}$) is passed, by charging a capacitor (C) in a low pass filter (24), in which the improvement comprises:

a delay means (40) for delaying said reference signal (REF) in time and producing a delayed reference signal (10);

a reset signal pulse means (34) for resetting said reset logic means (30) to an initial condition in which said capacitor (C) is charged to a maximum value of variable delay control voltage ($V_{CTRL}$) which adjusts said variable delay line (20) to a minimum achievable time delay;

a phase detection means (21) for detecting a phase difference between said reference signal (REF) and said clock signal ($V_{OUT}$) and for detecting a phase difference between said delayed reference signal (10) and said clock signal ($V_{OUT}$), said phase detection means (21) having a first output control voltage ($V_c$) for controlling said variable delay line (20) and having a second output control voltage ($V_c'$) for enabling said first output control voltage ($V_c$) to control said variable delay line (20); and a reset logic means (30) for forcing said variable delay line (20) to continually increase delay, irrespective of the sense of said phase difference of said clock signal ($V_{OUT}$) with respect to said reference signal (REF) until said detection means (21) detects a condition such that a greater delay between said clock signal ($V_{OUT}$) and said reference signal (REF) will bring them into time alignment, and thereafter enabling said phase detection means (21), in response to said second output control voltage ($V_c'$), to control said variable delay line (20) with said first output control voltage ($V_c$);

said reset signal pulse means (34) being coupled to said reset logic means (30);

said reference signal (REF) being coupled to a first input of said phase detector means (21) and to an input of said delay means (40);

said delayed reference signal (10) being coupled from said delay means (40) to a second input of said phase detector means (21); and said clock signal ($V_{OUT}$) being coupled to a third input of said phase detector means (21);

said reset logic means (30) interposed between said phase detection means (21) and said variable delay line (20), being directly coupled to said phase detection means (21) and coupled to said variable delay line (20) through said low pass filter (24).

2. An apparatus as claimed in claim 1 in which said phase detection means (21) further comprises:

a first phase detector (22) for providing said first output control voltage ($V_c$) and an output voltage ($V_1$) complimentary to said first output control voltage ($V_1$);

a second, delayed phase detector (26) for providing an output voltage ($V_2$); and a first logic gate (28) for providing said second output control voltage ($V_c'$);

said first phase detector (22) having a first input terminal ($D_1$) coupled to said clock signal ($V_{OUT}$) and a second input terminal coupled to said reference signal (REF) and having a first output terminal ($Q_1$) coupled to a first input of said first logic gate (28) and having a second, complimentary output terminal (nQ) coupled directly to said reset logic means (30);

said second, delayed phase detector (26) having a first input terminal ($D_2$) coupled to said clock signal ($V_{OUT}$) and a second input terminal coupled to said delayed reference signal (10) through said delay means (40), and having an output terminal ($Q_2$), at which said output voltage ($V_2$) appears, coupled to said first logic gate (28);

said first phase detector (22) and said second delayed phase detector (26) coupled to said reset logic means (30).

3. An apparatus as claimed in claim 2 in which each of said first phase detector (22) and said second, delayed phase detector (26) comprises an edge-triggered, digital flip-flop circuit.

4. An apparatus as claimed in claim 1 in which said logic means (30) further comprises:
- a second logic gate (36) for providing an output having a value representing said first output control voltage ($V_c$) when enabled by a voltage representing a logic one at an input and providing an output having a value representing a logic one when enabled by a voltage having a value representing a logic zero at said input;
- a third logic gate (37) for providing an output voltage to charge said capacitor (C); and
- set-reset means (32) for controlling said output of said second logic gate (36) and said output of said third logic gate (37) in response to said second output control voltage ($V_c'$), and said reset signal pulse (34);
- said set-reset means (32), said second logic gate (36) and said third logic gate (37) all being coupled together, said first output control voltage ($V_c$) provided by said phase detection means (21) being coupled to an input of said second logic gate (36), said second output control voltage ($V_c'$) provided by said phase detection means (21) being coupled to a set terminal (s) of said set-reset means (32), and said third logic circuit (37) being coupled to said variable delay line (20) through said low pass filter (24).

5. An apparatus as claimed in claim 4 in which each of said second logic gate (36) and said third logic gate (37) comprises a NAND gate circuit.

6. An apparatus as claimed in claim 4 in which said set-reset means (32) comprises a set-reset integrated circuit (32) having a set input (s), a reset input (r) and a latched output (Q).

7. An improved variable delay locked loop apparatus for synchronization of clock signals having an extended frequency range, of a type having a phase detector which feeds back, by charging a capacitor (C) in a low pass filter (24), a variable delay control voltage ($V_{CTRL}$) to change the delay of a variable delay line (20), said variable delay control voltage ($V_{CTRL}$) depending on the relative phase of a low-power reference signal (REF) and a clock signal ($V_{OUT}$), derived from said reference signal (REF) which is passed through said variable delay line (20) and a power amplifier (12) and emerges as said clock signal ($V_{OUT}$), which said reference signal (REF) and said clock signal ($V_{OUT}$) are to be synchronized, in which the improvement comprises:
- a first phase detector (22) having a first input terminal ($D_1$), a second input terminal, a first output terminal ($Q_1$) and a second, complimentary output terminal (nQ);
- a second, delayed phase detector (26) having a first input terminal ($D_2$), a second input terminal and an output terminal ($Q_2$);
- a fixed delay element (40);
- a first logic gate (28);
- a logic circuit (30) having a set-reset circuit (32), a second logic gate (36) and a third logic gate (37); and
- a reset signal conductor (34);
- said first phase detector (22) connected at first output terminal ($Q_1$) to an input terminal of said first logic gate (28) and connected at said second, complimentary output terminal (nQ) to an input terminal of said second logic gate (36), said second, delayed phase detector (26) connected at said output terminal ($Q_2$) to an input terminal of said first logic gate (28);
- said set-reset circuit (32) having a reset terminal (r) commonly coupled to said reset signal conductor (34) and to an input terminal of said third logic gate (37), and said set-reset circuit (32) having a set terminal (s) coupled to an output terminal of said first logic gate (28), and having an output terminal (Q) coupled to an input terminal of said second logic gate (36);
- said third logic gate (37) having an output terminal coupled through said low pass filter (24) to said delay line (20).

8. In a method of synchronizing extended frequency range clock signals in a high speed, multiple chip, synchronous computer, of type in which the timing of a clock signal ($V_{OUT}$), which is derived from a low-power reference signal (REF), is charged in a variable delay locked loop circuit by using a digital phase detector to detect a phase difference between said clock signal ($V_{OUT}$) and said reference signal (REF) and feeding back a phase-detected output to control a variable delay line (20) through which said reference signal (REF) is passed, to emerge as said clock signal ($V_{OUT}$), by charging a capacitor (C) in a low pass filter (24), the improvement comprising the steps of:
- adjusting said variable delay line (20) to a state of minimum delay by driving said control voltage ($V_{CTRL}$) to a maximum value with a reset signal pulse (nReset) causing a charge to be stored in said capacitor (C);
- forcing said variable delay line (20) to continually increase delay by latching a logic circuit (30) in a state to continually decrease said control voltage ($V_{CTRL}$) by bleeding off said charge stored in said capacitor (C);
- detecting phase differences between said clock signal ($V_{OUT}$) and said reference signal (REF) in a first digital phase detector (22);
- delaying said reference signal (REF) slightly by a fixed delay element (40), producing a delayed reference signal (10) and detecting phase differences between said clock signal ($V_{OUT}$), and said delayed reference signal (10) in a second, delayed phase detector (26); and
- enabling said first phase detector (22) to control said variable delay line (20) by latching said logic circuit (30) in its alternate state, when said first digital phase detector (22) and said second digital phase detector (26) detect a condition in which a greater delay between said clock signal ($V_{OUT}$) and said reference signal (REF) will bring them into alignment.

* * * * *